(12) United States Patent
Urciuoli

(10) Patent No.: US 8,742,628 B2
(45) Date of Patent: Jun. 3, 2014

(54) SOLID STATE CIRCUIT BREAKER

(75) Inventor: Damian P. Urciuoli, Bowie, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 1071 days.

(21) Appl. No.: 12/768,898

(22) Filed: Apr. 28, 2010

(65) Prior Publication Data

US 2010/0277006 A1 Nov. 4, 2010

Related U.S. Application Data

(60) Provisional application No. 61/174,129, filed on Apr. 30, 2009.

(51) Int. Cl.
*B23K 11/24* (2006.01)

(52) U.S. Cl.
USPC .............. 307/112; 307/43; 307/80; 307/10.1; 257/263; 257/616; 257/723; 363/123; 330/277; 320/164

(58) Field of Classification Search
CPC .......... B23K 11/248; H02J 3/04; H01R 29/00
USPC ........ 307/112, 36, 141.8, 126, 139, 140, 130; 361/93, 58, 115, 19, 18, 57, 101, 91.7; 257/723, 724, 107, 173, 263
See application file for complete search history.

(56) References Cited

U.S. PATENT DOCUMENTS

| | | | |
|---|---|---|---|
| 4,571,606 A | 2/1986 | Benjamin et al. | |
| 5,057,791 A * | 10/1991 | Thompson et al. | ........... 330/277 |
| 5,066,869 A | 11/1991 | Neidorff | |
| 5,463,252 A * | 10/1995 | Jones et al. | .................... 257/723 |
| 5,606,482 A * | 2/1997 | Witmer | ........................ 361/93.7 |
| 5,714,777 A * | 2/1998 | Ismail et al. | .................. 257/263 |
| 5,726,848 A * | 3/1998 | Boenig | ........................ 361/93.9 |
| 5,742,463 A | 4/1998 | Harris | |
| 7,072,162 B2 * | 7/2006 | D'Amato | ..................... 361/91.7 |
| 7,199,491 B2 * | 4/2007 | Novinsky et al. | ............. 307/328 |
| 8,130,023 B2 | 3/2012 | Veliadis | |
| 2006/0198173 A1* | 9/2006 | Rozman | ........................ 363/123 |
| 2008/0204958 A1 | 8/2008 | Shearon et al. | |
| 2009/0033293 A1* | 2/2009 | Xing et al. | ..................... 320/164 |

OTHER PUBLICATIONS

Non-Patent Literature—Journal of Material Science: Materials in Electronics 17 (2006).*

* cited by examiner

*Primary Examiner* — Rexford Barnie
*Assistant Examiner* — Jagdeep Dhillon
(74) *Attorney, Agent, or Firm* — Eric Brett Compton

(57) ABSTRACT

A solid state circuit breaker includes a first terminal; a second terminal; a first wide-band gap field effect transistor coupled to the first terminal; a second wide-band gap field effect transistor coupled to the second terminal, wherein the first wide-band gap field effect transistor and the second wide-band gap field effect transistor are common-source connected to one another; and a bi-directional snubber device coupled to the first wide-band gap field effect transistor and the second wide-band gap field effect transistor. Such a solid state circuit breaker may also include a gate drive circuit coupled to the first wide-band gap field effect transistor and the second wide-band gap field effect transistor, where the gate drive circuit may comprise a voltage regulation stage and a drive stage.

21 Claims, 10 Drawing Sheets

SOLID STATE CIRCUIT BREAKER

CROSS REFERENCE TO RELATED APPLICATION

This application claims the benefit of U.S. Provisional Patent Application No. 61/174,129 filed on Apr. 30, 2009, the complete disclosure of which, in its entirety, is herein incorporated by reference.

GOVERNMENT INTEREST

The embodiments herein may be manufactured, used, and/or licensed by or for the United States Government without the payment of royalties thereon.

BACKGROUND

1. Technical Field

The embodiments herein generally relate to solid-state circuit breakers (SSCBs), and, more particularly, to highly fault tolerant, high speed solid-state circuit breakers.

2. Description of the Related Art

In convention high power systems (e.g., distributed and off-grid power systems and hybrid-electric ground vehicle power systems), power electronic converters and power distribution equipment operate up to several hundred volts and up to hundreds of kilowatts. To prevent damage to converters, or other system components, during fault conditions, such systems frequently require fault current interrupt speeds in tens to hundreds of microseconds. Moreover, in many of these systems, AC and DC power components operate between two voltage busses having independent sourcing capability and typically require bi-directional fault isolation. These requirements also include symmetric ratings for bi-directional voltage blocking in the off-state and bi-directional current conduction in the on-state.

Conventional systems in high power applications frequently use mechanical contactors. Mechanical contactors, however, do not generally provide adequate actuation speeds, and tend to suffer severe degradation during repeated fault isolation. In addition, high conduction losses and negative temperature coefficients of bipolar solid-state devices typically limit their practicality and scalability for high power applications.

SUMMARY

In view of the foregoing, an embodiment herein provides a system for bi-directional voltage blocking and current conducting comprising a first terminal; a second terminal; a first wide-band gap field effect transistor coupled to the first terminal; a second wide-band gap field effect transistor coupled to the second terminal, wherein the first wide-band gap field effect transistor and the second wide-band gap field effect transistor are common-source connected to one another; and a bi-directional snubber device coupled to the first wide-band gap field effect transistor and the second wide-band gap field effect transistor.

In such a system, at least one of the first wide-band gap field effect transistor and the second wide-band gap field effect transistor may comprise any of silicon carbide, gallium nitride, and diamond. Moreover, at least one of the first wide-band gap field effect transistor and the second wide-band gap field effect transistor may comprise a vertical junction gate field effect transistor. In addition, at least one of the first wide-band gap field effect transistor and the second wide-band gap field effect transistor may comprise a silicon carbide VJFET.

Such a system may further comprise a plurality of first wide-band gap field effect transistors in parallel connection with one another and coupled to the first terminal; and a plurality of second wide-band gap field effect transistors in parallel connection with one another and coupled to the second terminal. Furthermore, the plurality of first wide-band gap field effect transistors may share a common source with the plurality of second wide-band gap field effect transistors. In addition, the bi-directional snubber device may comprise a plurality of capacitors; a plurality of resistors operatively coupled to the plurality of capacitors; and a plurality of diodes operatively coupled to the plurality of capacitors and the plurality of resistors. Additionally, the plurality of capacitors, the plurality of resistors, and the plurality of diodes may have a component voltage rating at least as great as a transistor voltage rating of at least one of the first wide-band gap field effect transistor and the second wide-band gap field effect transistor.

In addition, the bi-directional snubber device may comprise a first snubber comprising a first capacitor, a first resistor, and a first diode oriented in a first direction, wherein the first diode comprises a first anode and a first cathode, wherein the first capacitor forms a serial connection with the first resistor and the first diode, and wherein the first resistor forms a parallel connection with the first diode; and a second snubber comprising a second capacitor, a second resistor, and a second diode oriented in a second direction, wherein the second diode comprises a second anode and a second cathode, wherein the first direction is distinct from the second direction, wherein the second capacitor forms a serial connection with the second resistor and the second diode, wherein the second resistor forms a parallel connection with the second diode, and wherein at least one of (i) the second anode of the second diode shares a connection with the first cathode of the first diode, and (ii) the second cathode of the second diode shares a connection with the first anode of the first diode. Furthermore, the bi-directional snubber device may comprise a plurality of capacitors; a plurality of resistors operatively coupled to the plurality of capacitors; and a plurality of semiconductor switches operatively coupled to the plurality of capacitors and the plurality of resistors.

Moreover, such a system may further comprise a gate drive circuit coupled to the first wide-band gap field effect transistor and the second wide-band gap field effect transistor, the gate drive circuit comprising a voltage regulation stage and a drive stage, wherein the drive stage comprises at least one of a single drive stage and a plurality of drive stages, wherein the plurality of drive stages comprises a first drive stage and a second drive stage, and wherein the first drive stage is coupled to the first wide-band gap field effect transistor and the second drive stage is coupled to the second wide-band gap field effect transistor. Additionally, the drive stage may further comprise at least one of an optically isolated drive stage or a magnetically coupled drive stage. Furthermore, the drive stage may be powered by an isolated DC-DC converter. The first drive stage and the second drive stage of the plurality of drive stages may also be individually controlled to perform any of delay turn-on and delay turn-off of signals to at least one of the first wide-band gap field effect transistor and the second wide-band gap field effect transistor. Additionally, the voltage regulation stage may comprise at least one of a first linear voltage regulator, and at least one of a second linear voltage regulator cascaded to the first linear voltage regulator, a first resistive voltage division, and a first zener diode voltage regulation, and a second resistive voltage division and a second zener diode voltage regulation.

Another embodiment herein provides a scalable bi-directional solid-state circuit breaker comprising a pair of vertical junction gate field effect transistor (VJFET) devices connected serially and sharing a common source; a bi-directional snubber device coupled to the pair of VJFET devices and comprising a plurality of capacitors, a plurality of resistors coupled to the plurality of capacitors, and a plurality of diodes coupled to the plurality of capacitors and the plurality of resistors; and a gate drive circuit comprising a plurality of voltage regulators coupled to at least one drive stage, wherein each drive stage is coupled to at least one VJFET in the pair of VJFET devices.

Such an apparatus may further comprise a plurality of pairs of VJFET devices sharing a common source, wherein the plurality of pairs of VJFET devices are connected in parallel. In addition, the voltage regulators may comprise at least one of a cascaded linear voltage regulator, a resistive voltage division regulator, and a zener diode voltage regulator. Moreover, the bi-directional snubber device may comprise a plurality of junction barrier Schottky diodes.

Another embodiment herein may provide a scalable bi-directional solid-state circuit breaker comprising a plurality of vertical junction gate field effect transistors (VJFETs) sharing a common source, the pair of VJFETs comprising silicon carbide; a bi-directional snubber device coupled to the plurality of VJFETs and comprising a plurality of capacitors, a plurality of resistors coupled to the plurality of capacitors, and a plurality of diodes coupled to the plurality of capacitors and the plurality of resistors; and a gate drive comprising a plurality of cascaded linear voltage regulators coupled to a plurality of optically isolated drive stages, wherein each drive stage in the plurality of optically isolated drive stages is coupled to one or more VJFETs in the plurality of VJFETs.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
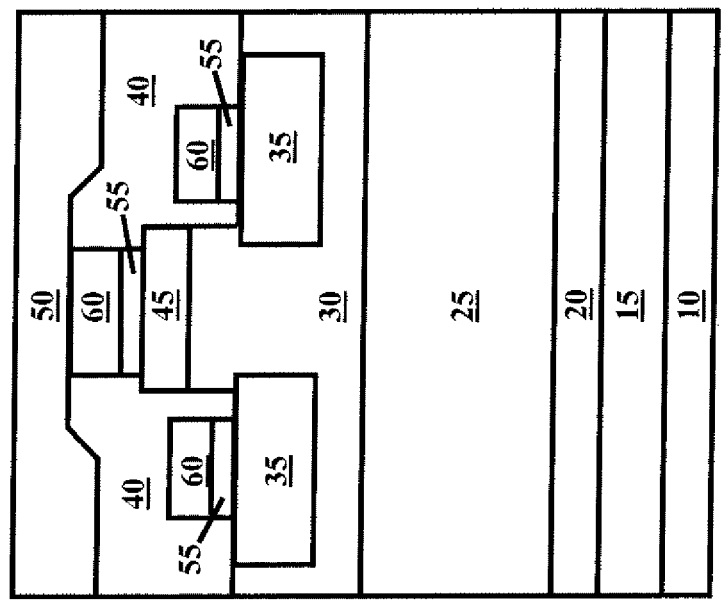
FIG. 1 illustrates a diagram of a cross-sectional unit cell schematic of a SiC VJFET structure according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a solid-state circuit breaker (e.g., silicon carbide (SiC) junction gate field effect transistor (JFET)), having high voltage blocking ratings (e.g., at or above 1200 V) and having low drain-to-source resistances (e.g., relative to other semiconductor switching devices at this voltage rating). Referring now to the drawings, and more particularly to FIGS. 1 through 10, where similar reference characters denote corresponding features consistently throughout the figures, there are shown preferred embodiments.

FIG. 1 illustrates a diagram of a cross-sectional unit cell schematic of SiC vertical JFET ("VJFET") 1 according to an embodiment herein. As shown in FIG. 1, VJFET 1 includes drain 10, $n^+$ substrate 15, $n^+$ buffer 20, $n^-$ drift layer 25, n channel 30, $p^+$ implant 35, dielectric 40, $n^+$ source 45, source interconnect 50, Ni Silicide 55, and gate metal interconnect 60. As described in further detail below, VJFET 1 is a normally-on SiC vertical JFET that has the capability of high-power and high-temperature switching. In addition, VJFET 1 is capable of high speed switching, and blocking high voltages (e.g., exceeding 1200 V). In circuit breaker applications, the normally-on structure of VJFET 1 is frequently preferred over a normally-off device. Furthermore, per unit of device active area, VJFET 1 exhibits a lower on-state voltage drop when compared to normally-off devices (e.g., SiC metal oxide semiconductor field-effect transistor (MOSFET) devices). Consequently, due to the low on-state voltage drop across the device, VJFET 1 reduces power dissipation and allows the reduction of either device size, or cooling requirement, or both.

Figure 2:
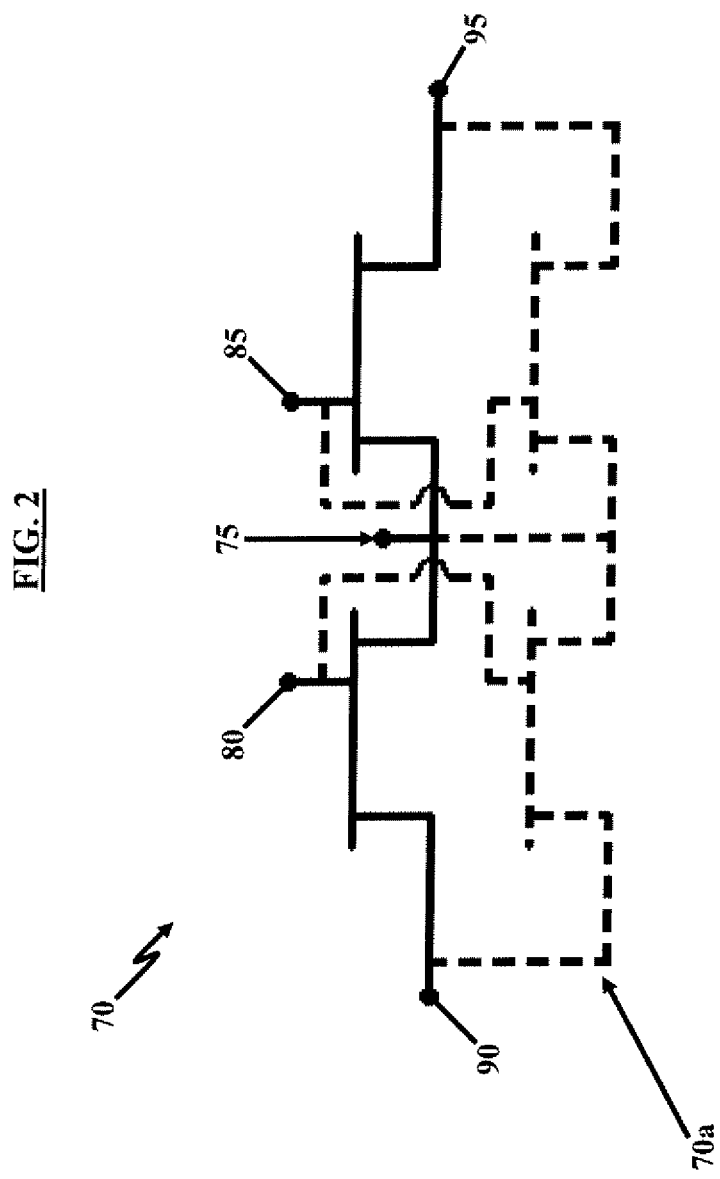
FIG. 2 illustrates a schematic diagram of a common-source VJFET structure according to an embodiment herein.

FIG. 2, with reference to FIG. 1, illustrates a schematic diagram of a common-source VJFET structure 70 according to an embodiment herein. As shown in FIG. 2, common-source VJFET structure 70 includes a single source 75, gates 80, 85 and drains 90, 95. Although VJFET 1 lacks a parasitic body diode between the drain and source terminals, VJFET 1 is not a symmetric device capable of bi-directional high-voltage blocking FIG. 2 also shows several common-source VJFET structures 70a in parallel connection.

Figure 3:
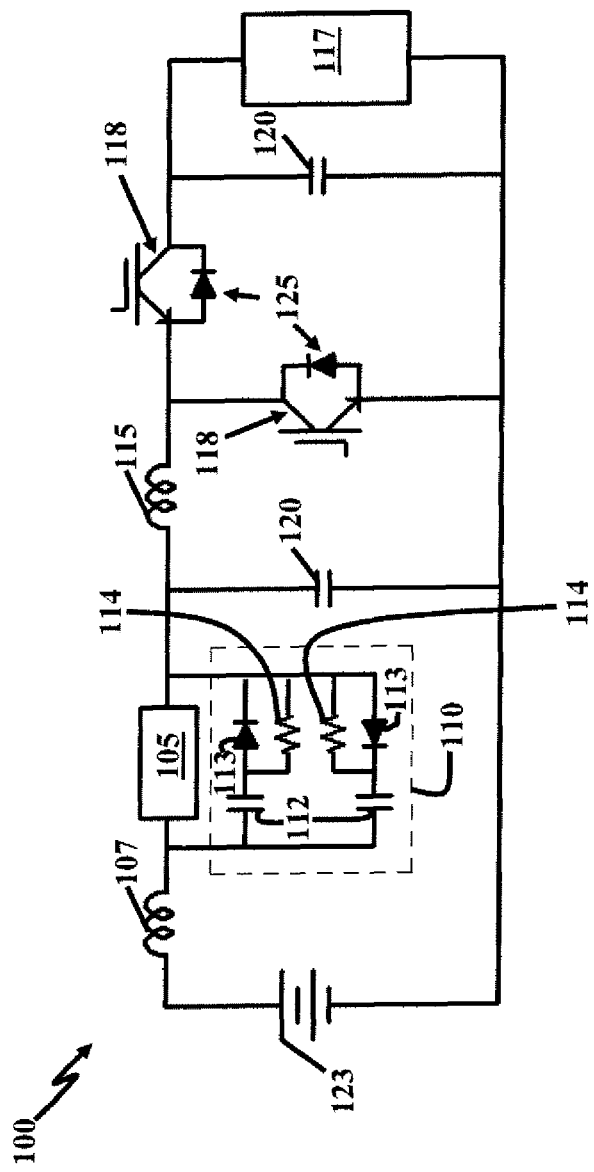
FIG. 3 illustrates a schematic diagram of a bi-directional RCD snubber and SSCB module in the circuit of a power converter according to an embodiment herein.

FIG. 3, with reference to FIGS. 1 and 2, illustrates a schematic diagram of a DC-DC converter 100 according to an embodiment herein. DC-DC converter 100 may be a high-power, single-phase, DC-DC, bi-directional converter, which may be used in regulating bus voltage and battery state of charge applications (e.g., in a hybrid-electric vehicle). As shown in FIG. 3, DC-DC converter 100 includes an SSCB module 105, parasitic line inductance 107, a bi-directional snubber 110 having snubber capacitors 112 and snubber diodes 113, and snubber resistors 114, inductor 115, capacitors 120, voltage source 123, IGBTs 118, anti-parallel diodes 125, and high side load/voltage source 117. SSCB module 105 may include SiC VJFET 1 (as shown in FIG. 1) and/or common-source VJFET structure 70 (as shown in FIG. 2). Moreover, SSCB module 105 may include a wide-band gap field effect transistor, and such wide-band gap field effect transistor may include any of silicon carbide, gallium nitride, and diamond. Abruptly arresting large currents flowing through parasitic inductances of power system cabling, bus bars, and interconnects can induce voltage spikes in excess of the breakdown voltage rating of semiconductor devices. With the increased transition speed of SSCB module 105 compared to that of a mechanical device, mitigation of inductive voltage spikes can be obtained by using snubbers (e.g., bi-directional snubber 110). The snubber 110 is used to suppress voltage transients across the SSCB module 105. Bi-directional snubber 110 preserves the two terminal structure of an ideal bi-directional fault protection module, where either terminal may not be referenced to ground. In addition, bi-directional snubber 110 is compatible with bi-directional current flow through SSCB module 105.

For example, when parasitic line inductance 107 is approximately ten micro-henries, bi-directional snubber 110, shown in FIG. 3, may prevent overvoltage on a 1200 V rated SSCB module 105. Thus, for example, a fault may cause current to rise through inductor 115 and is detected in SSCB module 105 initially conducting 500 A. SSCB module 105 may be subsequently actuated to a fully open state within 40 µs, with a transition time of 50 ns. This action results in a peak voltage for SSCB module 105 of approximately 1000 V, when 1.4 µF snubber capacitors 112 are used, for an interrupted current of over 900 A. Low average current rated 1200 V SiC JBS diodes can be used as snubber diodes 113 having high peak current ratings. In addition, a wide range of snubber resistor 114 values may be used, depending on the frequency of SSCB module 105 actuation.

Figure 4:
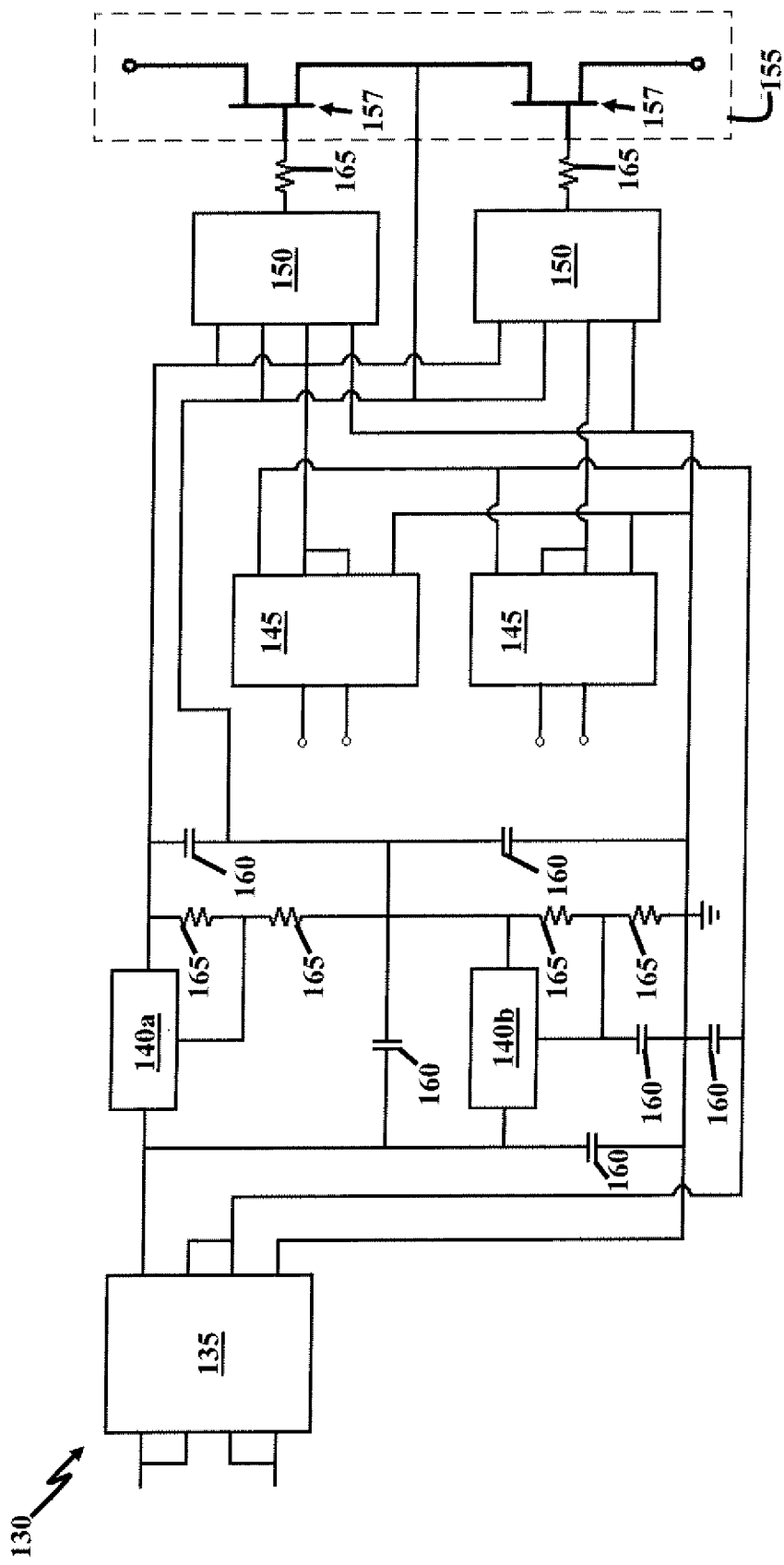
FIG. 4 illustrates a schematic diagram of a gate drive according to an embodiment herein.

FIG. 4, with reference to FIGS. 1 through 3, illustrates a schematic diagram of a gate drive 130 according to an embodiment herein. As shown in FIG. 4, gate drive 130 includes a dual output isolated DC-DC converter 135, voltage regulators 140a and 140b, optocoupler drivers 145, drivers 150, SSCB module 155, capacitors 160, and resistors 165. Gate drive 130 is configured to provide gate control and verify functionality of a preliminary low-current bi-directional VJFET based SSCB (e.g., SSCB module 155). In addition to the examples described below, the circuit design of gate drive 130 is also capable of supporting higher current devices for larger VJFET SSCB embodiments.

For example, one design of gate drive 130 may include a DC-DC converter 135 including a low-power, regulated, DC-DC converter to provide an isolated +/-15 V output (center tapped 30 V output bus). The 30 V output may subsequently feed two cascaded adjustable linear voltage regulators 140a, 140b. In addition to cascaded adjustable linear voltage regulators, voltage regulators 140a, 140b may also include resistive voltage division and/or a zener diode voltage regulation. Moreover, outputs of linear voltage regulators 140a, 140b establish the voltages used to bias the gate-to-source junctions of the VJFETs 157 of SSCB module 155. Linear voltage regulator 140b establishes the voltage level for an off-state using the full 30 volts from DC-DC converter 135 as an input source. For example, the off-state voltage applied from source-to-gate (negative) may be 20 V. The linear voltage regulator 140a provides the 2 V on-state bias for the VJFETs 157 using the difference in voltage between the 30 V supply and the output of voltage regulator 140b as an input source. In addition, the on-state resistance of some VJFET device structures 157 may be reduced by applying a small positive voltage bias to the gate-to-source junction. In so doing, however, the positive bias may not exceed the forward voltage of the parasitic gate to source diode, which is typically between 2.5 V and 3 V.

In the embodiment shown in FIG. 4, optocoupler drivers 145 may not necessarily be rated for adequate margin over the full gate voltage range. Therefore, drivers 150 are used as an additional drive stage to each optocoupler drive stage 145 to accommodate the full gate voltage range. The center tap of the DC-DC converter 135 output bus is used to power optocouplers 145. Two drive output stages (e.g., optocoupler drivers 145, and drivers 150) may be used so the VJFETs 157 in SSCB module 155 may be controlled separately if necessary. In addition, flexibility of variable timing of applied gate bias provides a method of compensating for mismatches in device transition time.

Figure 5:
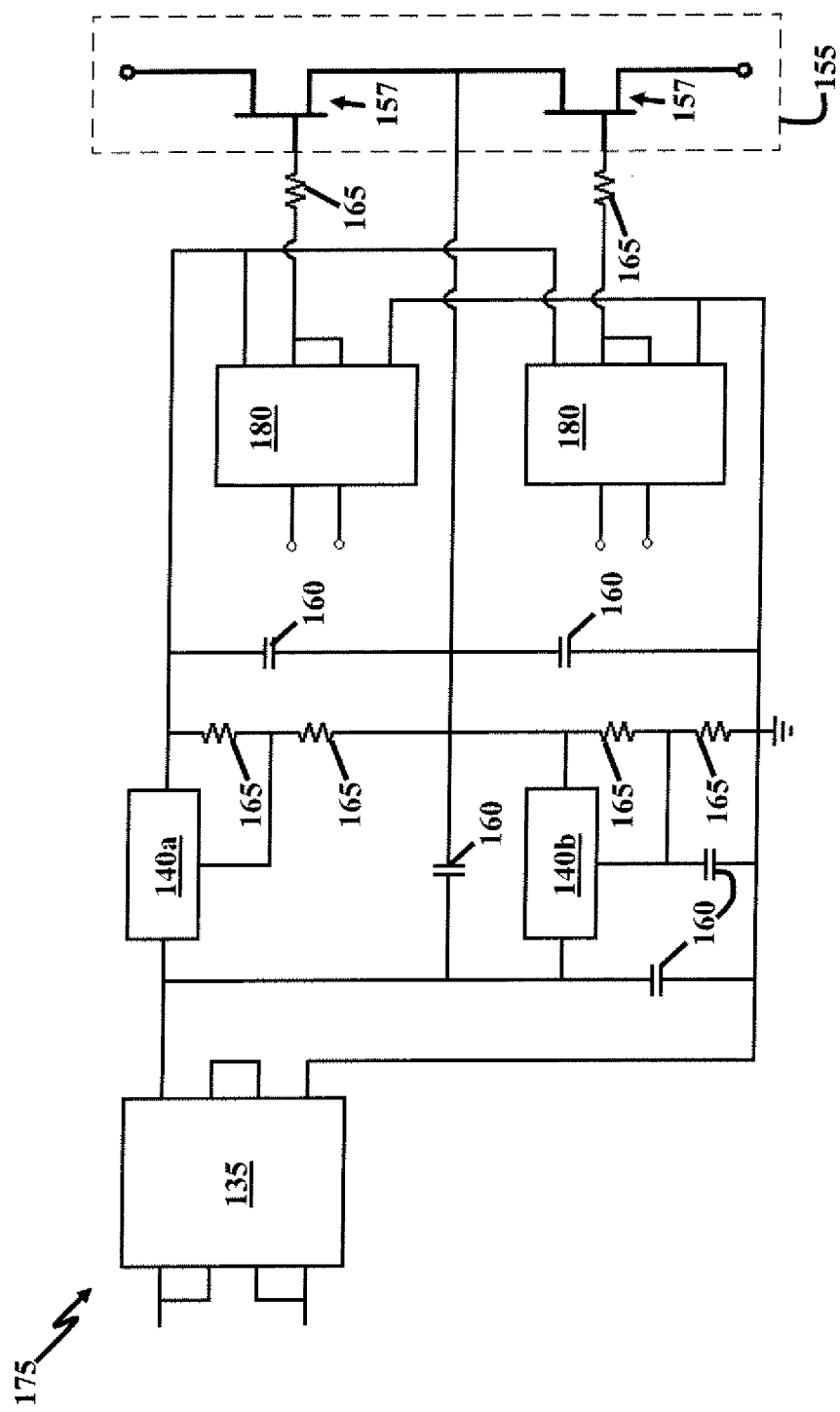
FIG. 5 illustrates a schematic diagram of a simplified gate drive according to an embodiment herein.

FIG. 5, with reference to FIGS. 1 through 4, illustrates a schematic diagram of a simplified gate drive 175 according to an embodiment herein. As shown in FIG. 5, gate drive 175 includes a DC-DC converter 135, voltage regulators 140a and 140b, optocoupler drivers 180, SSCB module 155, capacitors 160, and resistors 165. FIG. 5 shows a simplified gate drive schematic based on a similar design shown in FIG. 4. Optocoupler drivers 180, however, offer a higher supply voltage rating than optocoupler drivers 145 used in FIG. 5. Consequently, gate drive 175 does not utilize drivers 150, as shown in FIG. 4 for gate drive 130.

Figure 6:
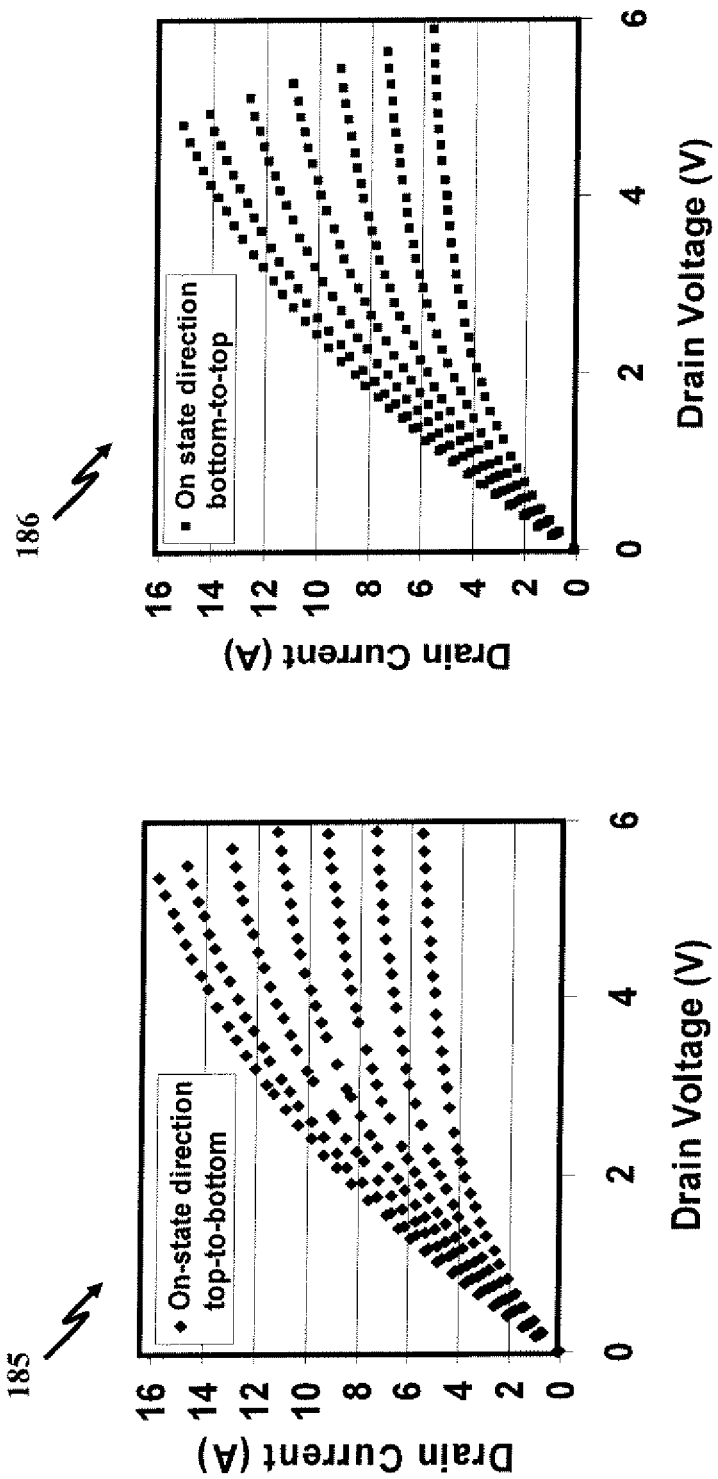
FIG. 6 illustrates a diagram of symmetric SiC VJFET bi-directional current conduction results of embodiments described herein.
Figure 7:
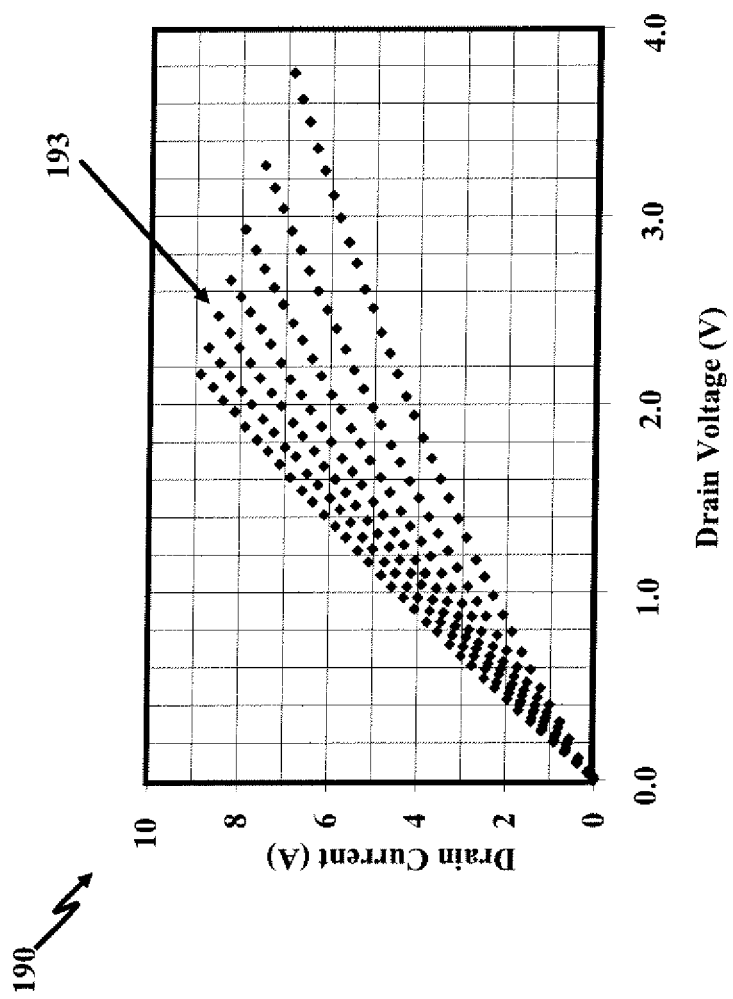
FIG. 7 illustrates a diagram of SiC VJFET drain current/drain voltage characteristics of embodiments described herein.
Figure 8:
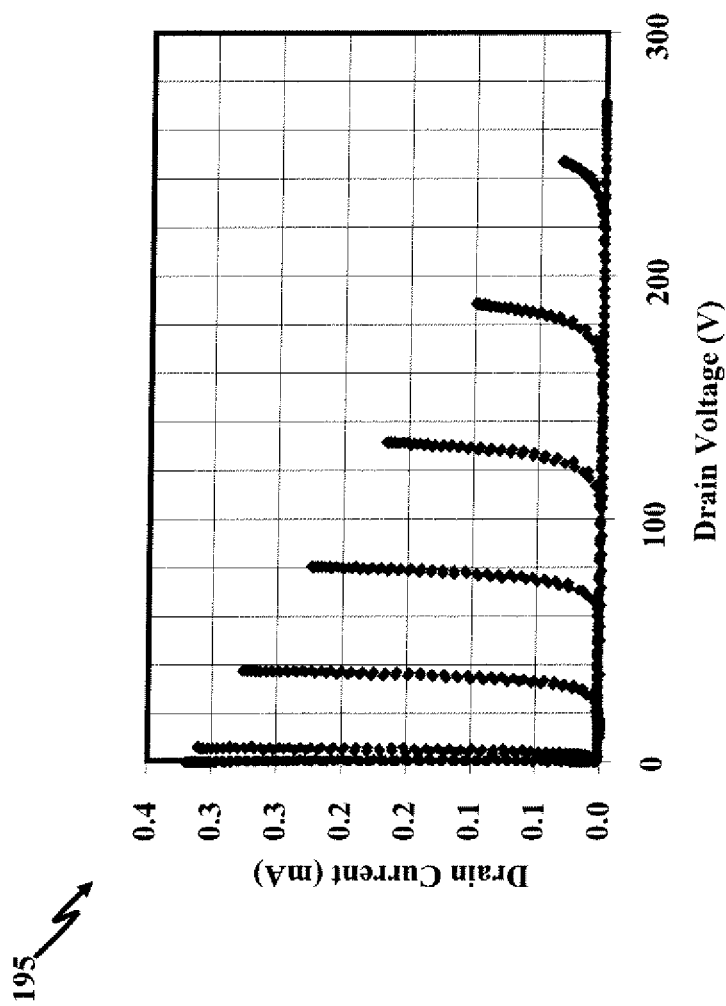
FIG. 8 illustrates a diagram of SiC VJFET voltage blocking characteristics of embodiments described herein.

FIG. 6, with reference to FIGS. 1 through 5, illustrates graph 185 and 186 that show the results of a bi-directional current conduction evaluation of two VJFETs connected in a common-source configuration as shown in FIG. 2. In FIG. 6, graph 185 shows on-state direction top-to-bottom current conduction traces at gate-to-source voltage biases ranging from approximately 0 V to 3 V, and graph 186 shows on-state direction bottom-to-top current conduction traces at gate to source voltage biases ranging from approximately 0 V to 3V. The bi-directional VJFET current conduction is symmetric. For example, one configuration uses 1200 V rated 0.03 cm$^2$ SiC VJFET devices. Two isolating packages, each having one 0.03 cm$^2$ SiC VJFET device are bonded and encapsulated for high-voltage operation. In addition, FIGS. 7 and 8, with reference to FIGS. 1 through 6, illustrate individual 0.03 cm$^2$ VJFET device conduction graph 190 and voltage-blocking graph 195, respectively. In achieving such results, an off-state gate bias of -20 V may be used, and a positive gate bias of 2 V may be used to reduce on-state resistance and to provide a 0.7 V margin below the 2.7 V forward conducting voltage of a parasitic gate-to-source diode (not shown). Such a $V_{GS}$=2 V curve is outlined by data trend 193, from the top of the forward conduction graph 190, shown in FIG. 7. Thus, embodiments described herein have been operated to show successful bi-directional voltage blocking and bi-directional current conduction up to a supply voltage of 600 V using a 300Ω load, a level of performance greater than what is available in conventional devices. As shown in FIGS. 6-8, the performance of VJFET structure 70 (shown in FIG. 2), as used in, for example, in the SSCB module 105 (shown in FIG. 3), produces an unexpected level of performance for a solid-state circuit breaker. Although the embodiments shown in FIGS. 6-8 illustrate a small test device, the operation demonstrated in FIG. 8 of those embodiments can be scaled by those of ordinary skill in the art to exceed the high power performance of mechanical devices (e.g., speed of the device) and conventional solid-state devices (e.g., high voltage operation).

Figure 9:
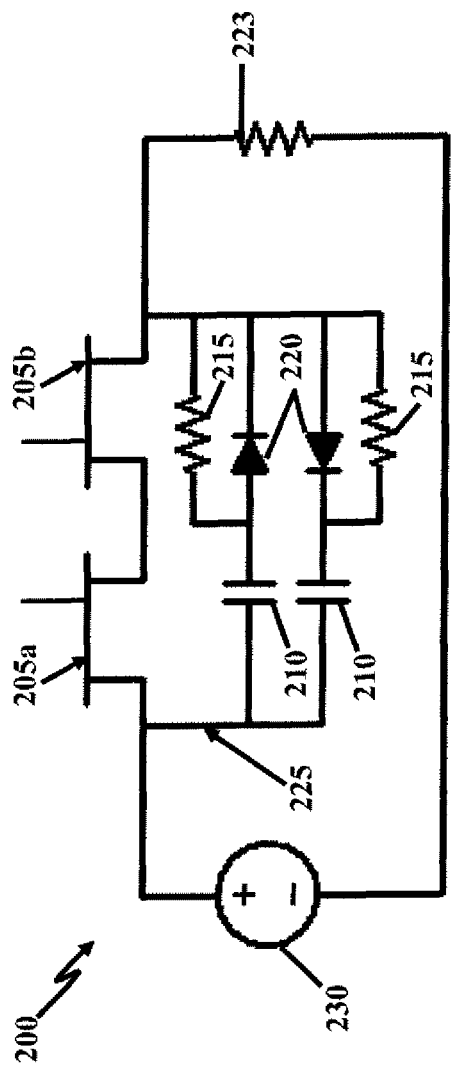
FIG. 9 illustrates a schematic diagram of a simplified common-source VJFET SSCB test circuit according to an embodiment herein.

FIG. 9, with reference to FIGS. 1 through 8, illustrates a schematic diagram of a common-source VJFET SSCB test circuit 200 according to an embodiment herein. The common-source VJFET SSCB test circuit 200 may include, for example, VJFETs 205a, 205b, capacitors 210, resistors 215, diodes 220 and resistive load 223. In addition, capacitors 210, resistors 215, and diodes 220 together form a bi-directional snubber 225. As shown, VJFETs 205a, 205b are connected in series, with bi-directional snubber 225 connected between the two terminals of VJFETs 205a, 205b. Also shown in FIG. 9 is a DC power supply 230, used as a source, and resistive load 223, which are connected in series with VJFETs 205a, 205b.

Figure 10:
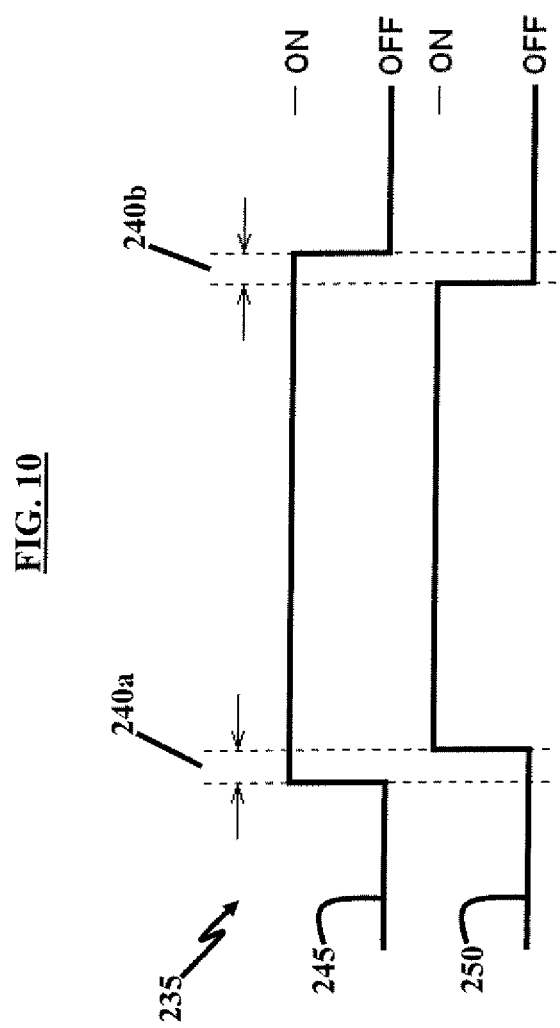
FIG. 10 illustrates a schematic diagram of a gate signal delay sequence according to an embodiment herein.

In one embodiment, VJFETs 205a, 205b may initially be held in the off-state at a VGS of −20 V. Voltage on DC power supply 230 may then be raised to a desired level. A gate pulse of 2 V may then be used to bias VJFETs 205a, 205b to an on-state for five milliseconds, after which, the gate bias may be returned to −20 V. It may be seen that in either direction of current flow, the reverse conducting VJFET reaches off-state before the forward conducting VJFET. This effect can damage the reverse conducting VJFET by exceeding its low reverse voltage breakdown limit before voltage is blocked by the forward conducting VJFET. To remedy the issue, a delayed turn-on signal may be provided to the device in position to forward conduct (e.g., a voltage blocking device). A delayed turn-off signal may also be provided to the device in position to reverse conduct. FIG. 10, with reference to FIGS. 1 through 9, illustrates gate signals 235 according to an embodiment herein. As shown in FIG. 10, delays 240a and 240b are introduced to non-blocking/reverse conducting device non-inverted gate signal 245 and blocking/forward conducting device to non-inverted gate signal 250. By introducing the delay shown in FIG. 10, embodiments described herein may prevent, or mitigate, damage caused by reverse conducting VJFET (e.g., VJFET 205b shown in FIG. 9) attributable to exceeding the VJFET's low reverse voltage breakdown limit before voltage is blocked by the forward conducting VJFET (e.g., VJFET 205a as shown in FIG. 9).

In addition, undesired forward conduction of a parasitic gate-to-drain diode (not shown) may cause continuous gate current. To avoid an undesirable turn-on of the parasitic gate-to-drain diode of reverse-conducting VJFETs (e.g. either 205a or 205b, shown in FIG. 9), biasing conditions may be taken into consideration for simplified common-source VJFET SSCB 200 or other embodiments described herein. Reducing or eliminating the positive gate bias of VJFETs 205a, 205b may increase the range of operating current but may also increase device on-state resistance and power dissipation. VJFETs 205a, 205b requiring low positive gate bias may be used, or the current ratings of SSCB 200 may be set to prevent forward conduction of the parasitic diode (not shown).

The embodiments described herein can provide fault protection in a variety of systems, which include but are not limited to AC systems, DC systems, AC-to-AC power conversion and/or power distribution systems, AC-to-DC power conversion and/or power distribution systems, DC-to-AC power conversion and/or power distribution systems, and DC-to-DC power conversion and/or power distribution systems.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A system for bi-directional voltage blocking and current conducting comprising:
   a first terminal;
   a second terminal;
   a first wide-band gap field effect transistor coupled to said first terminal;
   a second wide-band gap field effect transistor coupled to said second terminal, wherein said first wide-band gap field effect transistor and said second wide-band gap field effect transistor are common-source connected to one another; and
   a bi-directional snubber device coupled to said first wide-band gap field effect transistor and said second wide-band gap field effect transistor.

2. The system of claim 1, wherein at least one of said first wide-band gap field effect transistor and said second wide-band gap field effect transistor comprise any of silicon carbide, gallium nitride, and diamond.

3. The system of claim 1, wherein at least one of said first wide-band gap field effect transistor and said second wide-band gap field effect transistor comprise a vertical junction gate field effect transistor.

4. The system of claim 1, wherein at least one of said first wide-band gap field effect transistor and said second wide-band gap field effect transistor comprise a silicon carbide VJFET.

5. The system of claim 1, further comprising:
   a plurality of first wide-band gap field effect transistors in parallel connection with one another and coupled to said first terminal; and
   a plurality of second wide-band gap field effect transistors in parallel connection with one another and coupled to said second terminal.

6. The system of claim 5, wherein said plurality of first wide-band gap field effect transistors share a common source with said plurality of second wide-band gap field effect transistors.

7. The system of claim 1, wherein said bi-directional snubber device comprises:
   a plurality of capacitors;
   a plurality of resistors operatively coupled to said plurality of capacitors; and
   a plurality of diodes operatively coupled to said plurality of capacitors and said plurality of resistors.

8. The system of claim 7, wherein said plurality of capacitors, said plurality of resistors, and said plurality of diodes have a component voltage rating at least as great as a transistor voltage rating of at least one of said first wide-band gap field effect transistor and said second wide-band gap field effect transistor.

9. The system of claim 1, wherein said bi-directional snubber device comprises:
a first snubber comprising a first capacitor, a first resistor, and a first diode oriented in a first direction, wherein said first diode comprises a first anode and a first cathode, wherein said first capacitor forms a serial connection with said first resistor and said first diode, and wherein said first resistor forms a parallel connection with said first diode; and
a second snubber comprising a second capacitor, a second resistor, and a second diode oriented in a second direction, wherein said second diode comprises a second anode and a second cathode, wherein said first direction is distinct from said second direction, wherein said second capacitor forms a serial connection with said second resistor and said second diode, wherein said second resistor forms a parallel connection with said second diode, and wherein at least one of (i) said second anode of said second diode shares a connection with said first cathode of said first diode, and (ii) said second cathode of said second diode shares a connection with said first anode of said first diode.

10. The system of claim 1, wherein said bi-directional snubber device comprises:
a plurality of capacitors;
a plurality of resistors operatively coupled to said plurality of capacitors; and
a plurality of semiconductor switches operatively coupled to said plurality of capacitors and said plurality of resistors.

11. The system of claim 1, further comprising:
a gate drive circuit coupled to said first wide-band gap field effect transistor and said second wide-band gap field effect transistor, said gate drive circuit comprising a voltage regulation stage and a drive stage,
wherein said drive stage comprises at least one of a single drive stage and a plurality of drive stages,
wherein said plurality of drive stages comprises a first drive stage and a second drive stage, and
wherein said first drive stage is coupled to said first wide-band gap field effect transistor and said second drive stage is coupled to said second wide-band gap field effect transistor.

12. The system of claim 11, wherein said drive stage further comprises at least one of an optically isolated drive stage or a magnetically coupled drive stage.

13. The system of claim 11, wherein said drive stage is powered by an isolated DC-DC converter.

14. The system of claim 11, wherein said first drive stage and said second drive stage of said plurality of drive stages are individually controlled to perform any of delay turn-on and delay turn-off of signals to at least one of said first wide-band gap field effect transistor and said second wide-band gap field effect transistor.

15. The system of claim 11, wherein said voltage regulation stage comprises at least one of:
a first linear voltage regulator, and at least one of:
a second linear voltage regulator cascaded to said first linear voltage regulator,
a first resistive voltage division, and
a first zener diode voltage regulation, and
a second resistive voltage division and a second zener diode voltage regulation.

16. A scalable bi-directional solid-state circuit breaker comprising:
a pair of vertical junction gate field effect transistor (VJFET) devices connected serially and sharing a common source;
a bi-directional snubber device coupled to said pair of VJFET devices and comprising a plurality of capacitors, a plurality of resistors coupled to said plurality of capacitors, and a plurality of diodes coupled to said plurality of capacitors and said plurality of resistors; and
a gate drive circuit comprising a plurality of voltage regulators coupled to at least one drive stage, wherein each drive stage is coupled to at least one VJFET in said pair of VJFET devices.

17. The scalable bi-directional solid-state circuit breaker of claim 16, further comprising a plurality of pairs of VJFET devices sharing a common source, wherein said plurality of pairs of VJFET devices are connected in parallel.

18. The scalable bi-directional solid-state circuit breaker of claim 16, wherein said voltage regulators comprises at least one of a cascaded linear voltage regulator, a resistive voltage division regulator, and a zener diode voltage regulator.

19. The scalable bi-directional solid-state circuit breaker of claim 16, wherein said bi-directional snubber device comprises a plurality of junction barrier Schottky diodes.

20. A scalable bi-directional solid-state circuit breaker comprising:
a plurality of vertical junction gate field effect transistors (VJFETs) sharing a common source, said pair of VJFETs comprising silicon carbide;
a bi-directional snubber device coupled to said plurality of VJFETs and comprising a plurality of capacitors, a plurality of resistors coupled to said plurality of capacitors, and a plurality of diodes coupled to said plurality of capacitors and said plurality of resistors; and
a gate drive comprising a plurality of cascaded linear voltage regulators coupled to a plurality of optically isolated drive stages, wherein each drive stage in said plurality of optically isolated drive stages is coupled to one or more VJFETs in said plurality of VJFETs.

21. The scalable bi-directional solid-state circuit breaker of claim 16, wherein two of the plurality of diodes are arranged in opposite orientations with respect to one another in the bi-directional snubber device.

* * * * *